United States Patent [19]

Dotson

[11] Patent Number: 5,170,400
[45] Date of Patent: Dec. 8, 1992

[54] MATRIX ERROR CORRECTION FOR DIGITAL DATA

[75] Inventor: Ronald S. Dotson, Glendale, Calif.
[73] Assignee: California Institute of Technology, Pasadena, Calif.
[21] Appl. No.: 456,170
[22] Filed: Dec. 26, 1989
[51] Int. Cl.⁵ .................. G11B 20/18; G11B 20/16
[52] U.S. Cl. .................................................... 371/37.4
[58] Field of Search ........................................ 371/37.4

[56] References Cited

U.S. PATENT DOCUMENTS 3,800,281  3/1974  Devore et al. ............... 371/37.4
4,760,576  7/1988  Sato .............................. 371/37.4

OTHER PUBLICATIONS

Patel, A. et al., "Optical Rectangular Code for High Density Magnetic Tapes", *IBM Journal of Research and Development*, Nov. 1974, pp. 579-588.
T. Rao et al., *Error-Control Coding for Computer Systems*, Prentice-Hall, 1989, pp. 299-300.

Primary Examiner—Stephen M. Baker
Attorney, Agent, or Firm—Norman E. Brunell

[57] ABSTRACT

A technique for digital data error detection and correction is disclosed which adds alignment and checksum bytes to three sides of a matrix (24) of digital data to be protected. This technique is particularly used for the recording and storage (16,18) of digital data on video tape medium (14). The digital data is treated as a matrix block (24). Checksum and alignment bytes are added (20) to the digital data before tape storage and stripped (22) therefrom after successful alignment checks and data validation. In particular, the first column may be used to provide alignment bytes of a predetermined value for each row. The last column provides row checksum bytes for the data in each row. The last row provides column check sum bytes for each column, excluding the column of alignment bytes. The data location at the intersection of the row of column checksum bytes and the column of row checksum bytes may be used as a checksum byte for either the row or column checksum bytes.

2 Claims, 2 Drawing Sheets

MATRIX ERROR CORRECTION FOR DIGITAL DATA

ORIGIN OF THE INVENTION

The invention described herein was made in the performance of work under a NASA contract, and is subject to the provisions of Public Law 96-517 (35 USC 202) in which the Contractor has elected to retain title.

BACKGROUND OF THE INVENTION

1. Field of the Invention

The present invention relates to techniques for the storage and recovery of digital data on video tape. In particular, the present invention relates to techniques for error correction of digital data which are particularly useful when employed during the storage and recovery of digital data on video tape media.

2. Description of the Prior Art

The use of video tape for the storage of large quantities of digital data originally stored or created on other media has become increasingly attractive. Conventional techniques for video tape recording and storage of digital data, such as the VIDEOTRAX ® SYSTEM available from Alpha Microsystems of Santa Ana, California, are however susceptible to substantial data corruption. That is, the digital data often have unacceptable levels of error when recovered from the video tape storage media.

Conventional digital error correcting techniques assume a binary symmetric channel in which errors in transmitting successive digits occur independently. Data analysis indicates that such techniques are not optimizable for correcting digital data recovered from video tape storage.

SUMMARY OF THE INVENTION

The preceding and other shortcomings of the prior art are addressed and overcome by the present invention that provides, in a first aspect, a method for error detection and correction in the storage and recovery of digital data by encoding data to be stored in a matrix format. Row checksum locations are added to the matrix in which each row checksum location is in a particular row and the data stored therein represents a predetermined mathematical relationship with the remaining locations in that row. Column checksum locations are added to the matrix in which each column checksum location is in a particular column and the data stored therein represents a predetermined mathematical relationship with the remaining locations in that column. The matrix is then stored and recovered from storage.

The data in each checksum row and column location is compared to determine if that data accurately reflects the appropriate predetermined mathematical relationship with the locations related thereto. Attempts are made to correct the data in locations in which comparison of the data in the checksum row and column location indicates an error may have occurred. Then the matrix is stripped of all checksum row and column locations.

In another aspect, the present invention provides, a system for the storage and recovery of digital data with error detection and correction, including means for encoding data to be stored in a matrix format by adding row checksum locations to the matrix in which each row checksum location is in a particular row and the data stored therein represents a predetermined mathematical relationship with the remaining locations in that row and by adding column checksum locations to the matrix in which each column checksum location is in a particular column and the data stored therein represents a predetermined mathematical relationship with the remaining locations in that column, means for storing the encoded matrix of digital data, means for removing the encoded matrix of digital data from storage, means for comparing the data in each checksum row and column location to determine if that data accurately reflects the appropriate predetermined mathematical relationship with the locations related thereto, means for attempting to correct the data in locations in which comparison of the data in the checksum row and column location indicates an error may have occurred, and means for decoding the matrix by stripping out all checksum row and column locations.

DETAILED DESCRIPTION OF THE PREFERRED EMBODIMENT

In accordance with the present invention, it has been determined that video tape storage and recovery of digital data results in bursts of data corruption rather than the truly random errors which are typically assumed to occur and for which conventional error correction schemes are supposed to be optimized. These bursts of errors are thought to result from contaminants on tape 14 and/or on the tape heads associated with tape deck 16 for writing to or reading from tape 14.

The present invention makes use of this burst error pattern by optimizing the error detection and correction scheme for corruption in several contiguous digits in a data block. The error detection and correction scheme of the present invention models the digital data in a data block as two sets of linear equations. In each equation set, the right hand side of the equations are represented by checksum data added to the block during encoding and stripped from the block after successful decoding.

Figure 1:
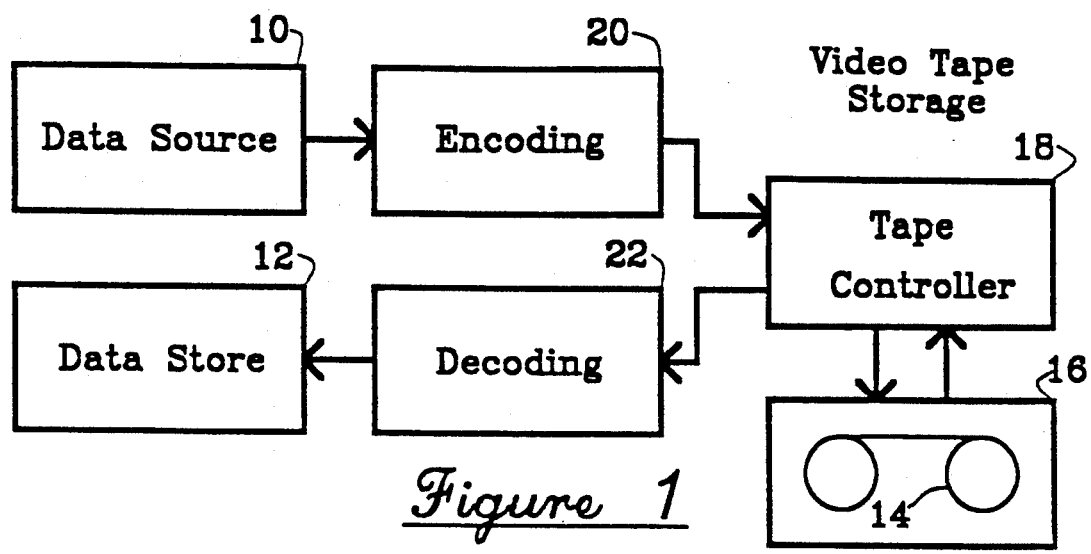
FIG. 1 is a block diagram illustration of a system for the video tape storage and recovery of digital data according to the present invention.

The digital data to be stored and recovered may originate from a variety of sources, indicated in FIG. I by data source 10. The most common sources of such digital data appropriate for storage on video tape media are the hard disks common in most microcomputers. The data when recovered is often returned to the original source, but may be returned to any number of data using systems, indicated in FIG. 1 as data store 12.

The video tape storage medium is shown as tape 14 which is mounted on tape deck 16 and operated by tape controller 18. Tape Controller 18 may conveniently be a card installed in the microcomputer, not shown, in which data source 10 and data store 12 may also be located. The devices described so far—data source 10, data store 12, tape 14, tape deck 16 and tape controller 18—are the major components in a conventional system for the video tape storage of digital data.

Conventional systems operate under software control to move digital data to be stored from data source 10 to tape 14. Tape 14 is transported on tape deck 16 by tape controller 18, also under software control. The data tapes may be moved and/or stored in other physical locations until the digital data is to be recovered. In any event, during recovery, tape 14 is transported on tape deck 16 by tape controller 18 in order to move the digital data to data store 12.

In accordance with the present invention, however, the digital data must first be encoded in encoder 20 before it is stored on tape 14 and must be decoded on decoder 22 before it is recovered and moved to data store 12.

A particularly convenient configuration for the practice of the present invention is a microcomputer system including a hard disk in which the data on the hard disk is stored for archival purposes on tape 14. In that configuration, the microcomputer hard disk serves as both data source 10 and data store 12 and the encoding and decoding operations of encoder 20 and decoder 22 are performed within the microcomputer on the hard disk as data is transferred from there on to and off from tape 14.

Figure 2:
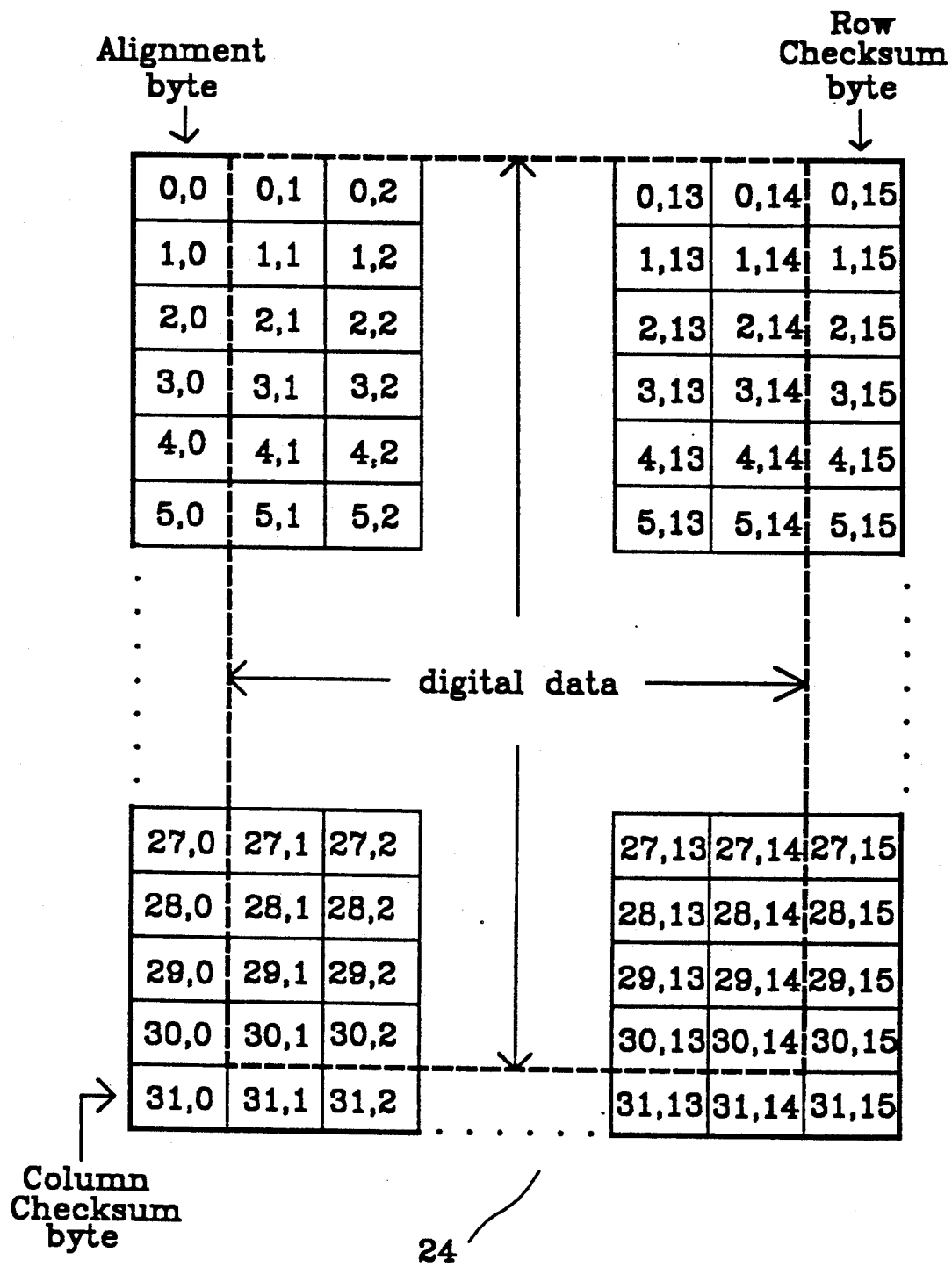
FIG. 2 is a partial illustration of the data storage bytes in a 512 byte block of digital data encoded according to the present invention.

The encoding operation performed within encoder 20 may best be described with reference to FIG. 2. FIG. 2 is a partial, graphical illustration of the data storage bytes in a 512 byte block of digital data encoded according to the present invention. Digital data to be stored and recovered is often moved in convenient sized blocks. The encoding operation required by the present invention will be described with reference to the commonly used 512 byte data block as an example. It is well within the skill of a man of ordinary skill in this art to apply the techniques described below to data blocks of other sizes.

A 512 byte data block may conveniently be viewed as a matrix having 32 rows and 16 columns. In this way, each byte of data may be identified by its row and column position in the matrix. The 512 byte data block partially depicted in FIG. 2 has 512 data locations in rows numbered from row 0 to row 31 and columns from column 0 to column 15. The data location in the upper right corner of the matrix may therefore be identified as byte 0,0 at the intersection of row 0 and column 0. Similarly the data location in the lower right hand corner of the matrix may be identified as byte 31,15 at the intersection of row 31 and column 15.

In accordance with the present invention data to be stored is moved out of data source 10 in blocks of 434 bytes which is stored in matrix 24 shown in FIG. 2. These 434 bytes of data are stored in matrix 24 in 31 rows and 14 columns from locations 0,1 to 30,14. The remaining locations in columns 0 and 15 as well as the rest of row 31 are used by encoder 20 to store data for error correction purposes.

The data stored in column 0 by encoder 20 are alignment bits. The information stored in these bytes is not used, but the physical pattern of bits is used to determine the alignment of the various system components as will be described in greater detail with reference to FIG. 3.

The data stored in each row location in column 16 by encoder 20 are check bytes representing a predetermined function of the data stored in the other column locations of that row, except the alignment byte in column 1. The information stored in these bytes is used to validate and/or correct the data within the other column locations in that row during decoding as will be described in greater detail with reference to FIG. 3.

The data stored in each column location in row 31, except column 0, are check bytes representing a predetermined function of the data stored in the other row locations of that column. The information stored in these bytes is used to validate and/or correct the data within the other row locations in that column during decoding as will be described in greater detail with reference to FIG. 3.

Many different alignment bytes may be used. For convenience the byte representing hexadecimal "AB" is used. In binary form, this byte has alternating bits in the form "1010 1011" and therefore avoids the long string of 0's which seems to be particularly susceptible to corruption. The byte locations used for alignment may be recovered for use for digital data storage without substantial degradation of the system if used with video tape record and playback equipment not particularly susceptible to alignment problems. This would permit the storage of 465 bytes of digital data in a 512 byte block.

Many different check byte functions may be used in accordance with the present invention. A particularly convenient conventional function, called checksum, will be described herein for the purpose of illustrating the present invention. Other check functions and/or variations thereof may also be used. Using checksum, the hexadecimal bytes in the row or column to be protected are simply added, the checksum representing the sum of these bytes.

Figure 3:
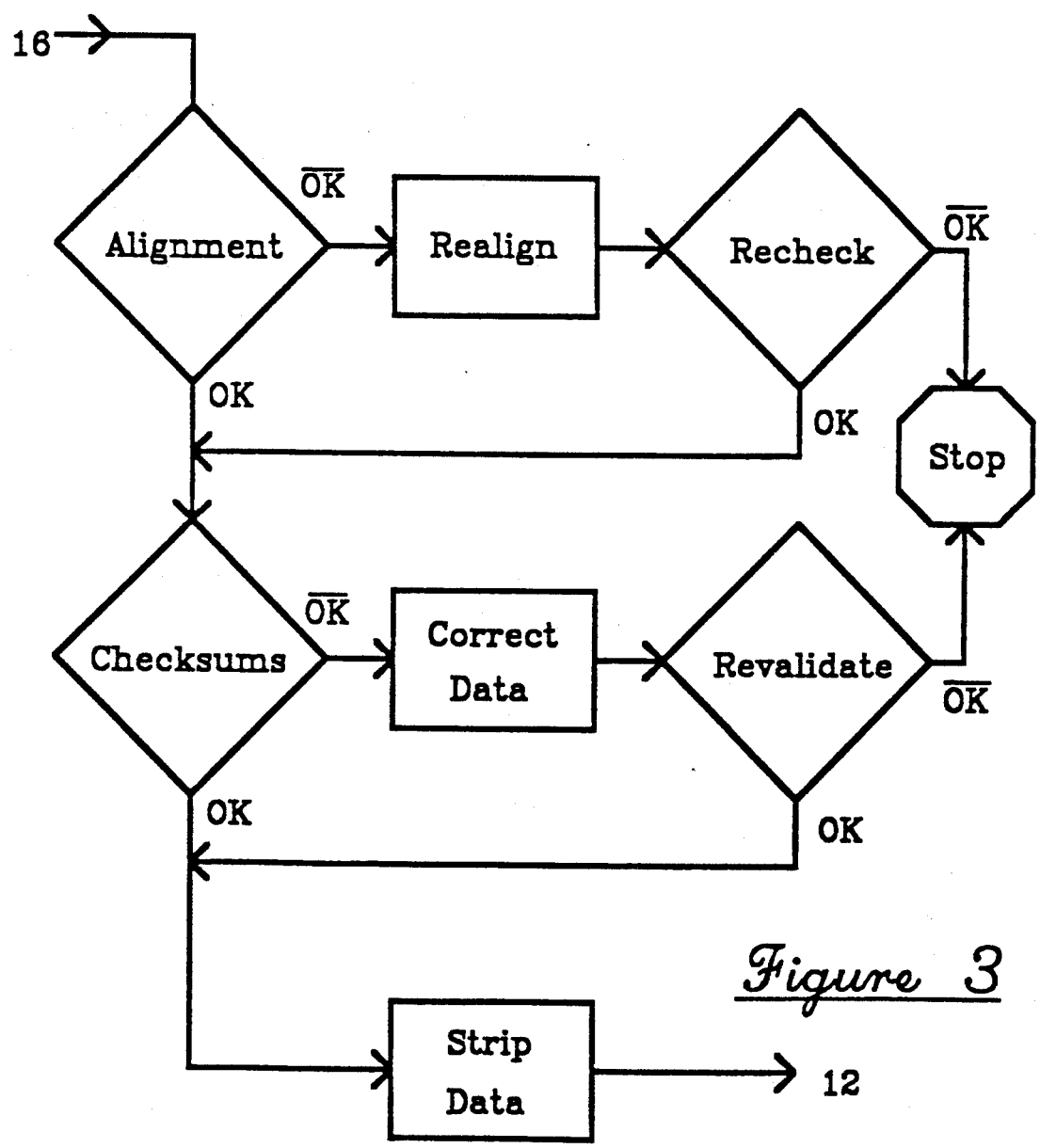
FIG. 3 is a block diagram illustration of the procedural flow for decoding and recovery of encoded digital data from video tape storage in accordance with the present invention.

FIG. 3 is a block diagram illustration of the procedural flow for decoding and recovery of digital data from video tape storage in accordance with the present invention. A 512 byte block of digital data for decoding is received from tape deck 16 and first checked for alignment using the alignment byte in column 0. Since the pattern of binary bits in the alignment bytes are predetermined and known, alignment may be checked simply by determining if the bits occur when expected.

If the data is not in alignment, an attempt is made to realign the data by shifting the time base a predetermined amount, typically one byte, while rechecking alignment. If the data remains out of alignment after a predetermined range of alignment attempts have been made, the decoding procedure is terminated. If the data is determined to be in alignment as a result of the original alignment check or the subsequent recheck, the check byte data is then validated.

Validation of the row checksum byte in location 0,15 will be described in greater detail to serve as an illustration of the validation performed for the remaining checksum bytes. During encoding, the byte in location 0,15 is set equal to the numerical sum of the binary data in all column locations in row 0, except the alignment byte. Since the value of this byte is fixed, it may be left out of the sum.

The sum of the digital data in locations 0,1 through 0,14 is compared to the checksum data in location 0,15. If these are equal, there is a strong probability that there were no errors in the data in row 0. If the sum of the data in location 0,1 through 0,14 does not equal the data in location 0,15, there was an error in either the digital data or in the checksum. The difference between the sum of the data in locations 0,1 through 0,14 and the data in location 0,15 will be referred to herein as the row 0 checksum error. Until further checksum validations are made, the column location or locations of the error or errors in row 0 cannot be determined.

After similar checksum validations are performed for rows 1 through 30, all rows in which there was corruption in the original digital data have been located by row. Checksum validations are then performed for the data in each column beginning with column 1.

In particular, the data in locations in column 1 from 0,1 through 30,1 are summed. This sum is compared with the checksum byte in location 31,1. If the values are equal, there is a strong probability that there were no errors in the data in column 1. If the value in location 31,1 is not equal to the sum of the data in column 1 in locations 0,1 through 30,1, there was an error in either the digital data in this column or in the checksum data at the last location in the column. The difference between the sum of the data in column 1 in locations 0,1 through 30,1 and the data in location 31,1 will be referred to herein as the column 1 checksum error.

If there is one error indication in a row checksum byte for a particular row and an error indication in a column checksum byte for a particular column, there is a strong probability that the data in the location at the intersection of that row and column was corrupted. That is, if row checksum 0 and column checksum 1 each indicate an error, there is a strong probability that the data in location 0,1 at the intersection of row 0 and column 1 was corrupted.

If the magnitudes of the checksum errors for a particular digital data byte location are equal, there is a strong probability that the value of the data in that location differs from its uncorrupted value by that magnitude. The value in that location will then be corrected by the magnitude of the checksum error and revalidated. In particular, if the row 0 checksum error equals the column 1 checksum error, then the data in location 0,1 can probably be corrected by adding or subtracting the value of the checksum error to the data in location 0,1 so that revalidation results in zero checksum errors.

In addition, location 31,15 may be used as a checksum byte for either the row checksum bytes in column 15 or the column checksum bytes in row 31. If the value of the data in location 31,15 does not equal the sum of the data in the appropriate locations in column 15 or row 31, the checksum data was corrupted and the digital data in the data matrix from locations 0,1 to location 31,14 cannot be validated without first attempting to validate the appropriate checksum data. The validation is an iterative or recursive process in which the validation of the data in some locations, for example the checksum checksums, may lead to the ability to validate data in other locations, such as the digital data to be decoded.

If column 0 is used for alignment bytes, it may be particularly convenient to use the data in location 0,0 for the row checksum checksum data and the data in location 31,15 for the column checksum checksum data. If column 0 is not used for alignment bytes, location 31,15 may conveniently be used as a checksum byte for the row checksum bytes in column 15 and location 31,0 may be used as a checksum byte for the column checksum bytes in row 31. The actual locations for the row and column checksum data as well as the row checksum and column checksum checksum bytes are not critical except that they must be disbursed throughout the matrix to reduce the opportunity for corruption of many such locations.

Once successful alignment checks and/or realignment and successful checksum validation and/or corrections has been made, the 512 byte data block may be stripped of all alignment and check sum bytes. The remaining digital data matrix from location 0,1 through 30,14 should then be equal to the original digital data encoded by encoder 20 and may be moved to data store 12.

A sample set of programs to implement a demonstration of the present invention have been written in the conventional programming language known as "C" and are included herewith, and incorporated by this reference herein, as Program Listing A.

While this invention has been described with reference to its presently preferred embodiments, its scope is not limited thereto. Rather, such scope is only limited in so far as defined by the following set of claims and includes all equivalents thereof.

PROGRAM LISTING A

```
#include <\c88\stdio.h>
#define ROWS 32
#define COLS 16
#define SYNCH (0xAB)
unsigned char dat[ROWS][COLS];                              /* 512 bytes */
/*------------------------- calcCheck -------------------------*/
void calcCheck(m)                              /* calculate check bytes for data in m */
unsigned char m[ROWS][COLS];
{
int row,col;
unsigned char c;
for (row=0; row<ROWS; row++)                                /* zero out checksum fields */
        {
        m[row][0] = SYNCH;
        m[row][COLS-1] = 0;                                 /* row checksums */
        }
for (col=1; col<COLS-1; col++)
    m[ROWS-1][col] = 0;                                     /* column checksums */
for (row=0; row<ROWS-1; row++)
        {
        for (col=1; col<COLS-1; col++)
                {
                c = m[row][col];
```

```c
            m[row][COLS-1] += c;                    /* calc row checksums */
            m[ROWS-1][col] += c;                    /* calc column checksums */
            }
    for (col=1; col<COLS-1; col++)                  /* checksum last row */
        m[ROWS-1][COLS-1] += m[ROWS-1][col];
    m[0][0] = 0;
    for (row=0; row<ROWS; row++)                    /* checksum last col */
        m[0][0] += m[row][COLS-1];
    }                                               /* calcCheck */
/*-------------------------- genData ---------------------------*/
void genData(m)                                     /* generate pseudo data into matrix m */
unsigned char m[ROWS][COLS];
{
int row,col;
unsigned char c;
c = 0;
for (row=0; row<ROWS-1; row++)
    for (col=1; col<COLS-1; col++)
        m[row][col] = c++;
}                                                   /* genData */
/*-------------------------- writeData ---------------------------*/
void writeData()
{
int testFile, halfK;
testFile = creat("test.001");
if (testFile == -1)
    {
    printf("\nError: Can't create 'test.001'");
    exit(1);
    }
for (halfK=0; halfK<256; halfK++)                   /* write 128K bytes */
    if (write(testFile,dat,sizeof(dat)) == -1)
        {
        printf("\nError: Can't write 'test.001'");
        exit(1);
        }
close(testFile);
}                                                   /* writeData */
/*-------------------------- main ---------------------------*/
main()
{
genData(dat);                                       /* generate pseudo data */
calcCheck(dat);
writeData();
}                                                   /* main */
/* end of enc.c */ define LIVE_DATA 1                                 /* FALSE => 'test.001', else 'crcx.001' */
define DEBUG     1
#define ROWS 32
#define COLS 16
#define SYNCH (unsigned char)(0xAB)                 /* has msb, lsb, & transitions */
#ifdef DESMET
#   include <\c88\stdio.h>
#else                                               /* M_I86 or TURBOC */
#   include <stdio.h>
#   include <stdlib.h>
#   include <io.h>
#   include <fcntl.h>
#   ifdef M_I86
#       include <sys\types.h>
#   endif
#   include <sys\stat.h>
#   define TRUE  1
#   define FALSE 0
#endif
#if LIVE_DATA
    char *inFileName  = "crcx.001";
    char *gudFileName = "crcx.gud";
    char *badFileName = "crcx.bad";
```

```
#else
    char *inFileName = "test.001";
    char *gudFileName = "test.gud";
    char *badFileName = "test.bad";
#endif                                                          /* LIVE_DATA */
int inFile, gudFile, badFile;
int record=0, copy=0, totalBlocks=0, corrections=0;
int goodBlocks=0, badBlocks=0, badChecks=0;
int badRows, badCols, badRow, rowCheckOk, colCheckOk, wasBadBlock, badSynchs;
int reAligned;
unsigned char badColNum[COLS];
unsigned char blockHdr[6];
unsigned char rowCheckSum[ROWS], colCheckSum[COLS];
unsigned char dat[ROWS][COLS];                    /* 512 bytes corrected data */
unsigned char crc[ROWS*COLS];                     /*
erroneous data */
/*------------------------- aligned ----------------------------------------*/
int aligned(m)
unsigned char m[];
{
unsigned char *p, *q;
badSynchs = 0;
for (p=m+COLS; p-m<ROWS*COLS; p+=COLS)
    {
    if (*p != SYNCH)
        badSynchs++;                                            /* this block only */
    }
if (badSynchs==0)
    return(TRUE);
if ((badSynchs==1 && p-m!=(COLS*(ROWS-1))) || checkSums(m))
    {
    badChecks++;                                                /* all blocks */
    wasBadBlock = TRUE;
    for (p=m+COLS; p-m<ROWS*COLS; p+=COLS)
        *p = SYNCH;
    return(TRUE);
    }
if (reAligned > 3)
    return(FALSE);                              /* don't get into infinite loop */
for (p=m+COLS, q=p+COLS; p-m<(ROWS*COLS-COLS); p+=COLS, q+=COLS)
    if (*p==SYNCH && *q!=SYNCH && *(q-1)==SYNCH)
        {
        wasBadBlock = TRUE;
        reAligned++;
        for (q=m+ROWS*COLS-1; q>p; q--)                         /* shift right */
            *q = *(q-1);
        return(aligned(m));                                     /* recheck */
        }
    else
        if (*p==SYNCH && *q!=SYNCH && *(q+1)==SYNCH)
            {
            wasBadBlock = TRUE;
            reAligned++;
            for (q=p+2; q<(m+ROWS*COLS); q++)                   /* shift left */
                *(q-1) = *q;
            return(aligned(m));                                 /* recheck */
            }
return(FALSE);
}                                                               /* aligned */
/*------------------------- checkSums --------------------------------------*/
int checkSums(m)                                    /* check row sumCheck fields */
unsigned char m[ROWS][COLS];    /* set badCols, badRows, badColNum, badRow */
{                                       /* return TRUE if block Ok, else FALSE */
int row,col,rowOk,colOk,i;
unsigned char c;
for (i=0; i<ROWS; i++)   rowCheckSum[i] = 0;
for (i=0; i<COLS; i++)   colCheckSum[i] = 0;
for (row=0; row<ROWS-1; row++)
    {
    for (col=1; col<COLS-1; col++)
        {
```

```
            c = m[row][col];
            rowCheckSum[row] += c;                              /* calc row checksums */
            colCheckSum[col] += c;                              /* calc column checksums */
            }
        }
    for (row=0; row<ROWS; row++)                                /* 'row checksum' col */
        colCheckSum[COLS-1] += m[row][COLS-1];
    if (colCheckSum[COLS-1] == m[0][0])
        rowCheckOk = TRUE;
    else
        rowCheckOk = FALSE;

for (col=1; col<COLS-1; col++)                              /* 'col checksum' row */
        rowCheckSum[ROWS-1] += m[ROWS-1][col];
    if (rowCheckSum[ROWS-1] == m[ROWS-1][COLS-1])
        colCheckOk = TRUE;
    else
        colCheckOk = FALSE;
    badRows = 0;
    rowOk = TRUE;
    for (row=0; row<ROWS; row++)
        {
        if (rowCheckSum[row] != m[row][COLS-1])
            {
            rowOk = FALSE;
            badRow = row;           /* if col checksum row bad, it must be the */
            badRows++;              /* last row number left in this variable */
            }
        }
    badCols = 0;
    colOk = TRUE;
    for (col=1; col<COLS-1; col++)
        if (m[ROWS-1][col] != colCheckSum[col])
            {
            colOk = FALSE;
            badColNum[col] = TRUE;
            badCols++;
            }
        else
            badColNum[col] = FALSE;
    return(rowOk && colOk);
    }                                                           /* checkSums */
/*------------------------- checkData ------------------------------------*/
int checkData(m)                        /* generate pseudo data into matrix m */
unsigned char m[ROWS][COLS];
{
int row,col, Ok;
unsigned char c;
c = 0;  Ok = TRUE;
for (row=0; row<ROWS-1; row++)
    for (col=1; col<COLS-1; col++)
        if (m[row][col] != c++)
            Ok = FALSE;
return(Ok);
}                                                               /* checkData */
/*------------------------- correctByte ----------------------------------*/
int correctByte(data,row,col)
unsigned char data[][COLS];
int row, col;
{
int i;
unsigned char rowCheck, colCheck, rowChar, colChar;
rowCheck = colCheck = 0;
data[row][col] = 0;
for (i=1; i<COLS-1; i++)                                        /* across the rows */
    rowCheck += data[row][i];
for (i=0; i<ROWS-1; i++)                                        /* down the columns */
    colCheck += data[i][col];
rowChar = data[row][COLS-1] - rowCheck;
colChar = data[ROWS-1][col] - colCheck;
if ((rowChar==colChar) || colCheckOk)
```

```c
        {
        data[row][col] = colChar;
        return(TRUE);
        }
    else
        if ((badCols==1) && rowCheckOk)
            {
            data[row][col] = rowChar;
            return(TRUE);
            }
        else
            return(FALSE);
}                                                                       /* correctByte */
/*------------------------- correct1 ------------------------------------*/
int correct1(data)          /* only get here for a bad block (ie., bad checksum) */
unsigned char data[][COLS];
{
int i;
unsigned char rc;
#if DEBUG
if (checkSums(data))                                                    /* if data already Ok */
    {
    printf("\nError(correct1): checkSums Ok at entrance");
    exit(1);
    }
#endif
if ((badRows>1 && badRow!=ROWS-1) || (badRows>1 && badCols>1))
    return(FALSE);

if (badRows==1 && badCols==0 && !rowCheckOk)     /* bad char in row checksums */
    {
    badChecks++;
    rc = 0;
    if (badRow==ROWS-1) goto out;
    data[badRow][COLS-1] = 0;
    for (i=0; i<ROWS; i++)                                              /* correct */
        rc += data[i][COLS-1];
    data[badRow][COLS-1] = data[0][0] - rc;
    if (checkSums(data))
        return(TRUE);                                                   /* no more errors */
    }
out:;

for (i=COLS-2; i>0; i--)
    if (badColNum[i])
        {
        if (!correctByte(data,badRow,i))
            return(FALSE);
        else
            {
            if (badRow==ROWS-1)                                         /* col checksum row */
                {
                badChecks++;
                if (checkSums(data))
                    return(TRUE);                                       /* else try to correct the data */
                }
            }
        }
return(checkSums(data)? TRUE: FALSE);
}                                                                       /* correct1 */
/*------------------------- corrected ----------------------------------*/
int corrected(src,dest)
unsigned char src[];
unsigned char dest[][COLS];
{
extern void move(), writeBlock();
extern int aligned(), checkData();
int alignment, i;

wasBadBlock = FALSE;                                                    /* may be set by aligned() */
reAligned = 0;
```

```c
    if (aligned(src))
        {
#if DEBUG
        if (reAligned)
            printf("  Re-Aligned, ");
        else
            printf("     Aligned, ");
#endif
        move(src,dest);
        alignment = TRUE;
        }
    else
        {
#if DEBUG
        printf(" Not Aligned, ");
#endif
        alignment = FALSE;
        } if (checkSums(src) && (wasBadBlock==FALSE))
        {
        goodBlocks++;
#if DEBUG
        printf("CheckSums Ok,    ");
#endif
        }
    else
        {
        wasBadBlock = TRUE;              /* may have already been set by aligned() */
        badBlocks++;
#if DEBUG
        printf("%2d/%2d Rows/Cols, ",badRows,badCols);
#endif
        } i = checkData(src);
if DEBUG
    if (i)
        printf(" Data  Ok");
    else
        printf(" Data Bad");
endif if (!alignment)
        {
#if DEBUG
        printf("\n");
#endif
        writeBlock(src,badFile);
        return(FALSE);
        } if (!wasBadBlock)
        {
        writeBlock(src,gudFile);
#if DEBUG
        printf(", Correct\n");
#endif
        return(TRUE);
        } if (checkSums(dest))            /* SYNCH error that was corrected by align() */
        {
        writeBlock(dest,gudFile);
#if DEBUG
        printf(", Corrected SYNCH\n");
#endif
        return(TRUE);
        }
    else
        {
```

```c
     if (correct1(dest))                          /* bad block that's aligned */
         {
         writeBlock(dest,gudFile);
#if DEBUG
         printf(", Corrected\n");
#endif
         return(TRUE);
         }
     else
         {
#if DEBUG
         printf("\n");
#endif
         writeBlock(dest,badFile);
         return(FALSE);
         }
     }
#ifndef TURBOC
printf("\nError(corrected): Why did I get here?");
exit(1);
#endif
}                                                                /* corrected */
/*------------------------- move ------------------------------------------*/
void move(f,t)
unsigned char *f, *t;
{
int i;
for (i=0; i<ROWS*COLS; i++)
    *t++ = *f++;                                            /* temporarily */
}                                                            /* move */
/*------------------------- openFiles -------------------------------------*/
void openFiles()
{
#ifdef DESMET
inFile = open(inFileName,0);                                /* read */
#else
inFile = open(inFileName,O_RDONLY|O_BINARY);                /* read */
#endif
if (inFile == -1)
    {
    printf("\nError: Can't open '%s'",inFileName);
    exit(1);
    }
#ifdef DESMET
gudFile = creat(gudFileName);
badFile = creat(badFileName);
#endif
#ifdef TURBOC
gudFile = creat(gudFileName,O_CREAT|O_TRUNC|O_BINARY|S_IWRITE);
badFile = creat(badFileName,O_CREAT|O_TRUNC|O_BINARY|S_IWRITE);
#endif
#ifdef M_I86
gudFile = open(gudFileName,O_CREAT|O_TRUNC|O_BINARY|O_WRONLY);
badFile = open(badFileName,O_CREAT|O_TRUNC|O_BINARY|O_WRONLY);
#endif
if (gudFile == -1)
    {
    printf("\nError: Can't create '%s'",gudFileName);
    exit(1);
    }
if (badFile == -1)
    {
    printf("\nError: Can't create '%s'",badFileName);
    exit(1);
    }
}                                                            /* OpenFiles */
/*------------------------- readBlock -------------------------------------*/
int readBlock(p)
unsigned char *p;                                            /* size = ROWS*COLS */
{
int i;
```

```
#if !LIVE_DATA
record++;
#else                                                     /* using real data */
i = read(inFile,blockHdr,6);
if (i == -1 || i == 0)
    return(0);
if (i!=6)
    {
    printf("\nError(readBlock): Invalid header");
    exit(1);
    }
if (blockHdr[0]==0x80)
    {
    printf("\nreadBlock: End of Tape record");
    return(0);
    }
record = *(int *)(&blockHdr[2]);
copy = (int)((unsigned char)blockHdr[1]);
endif                                                    /* LIVE_DATA */ i = read(inFile,p,ROWS*COLS);
if (i == -1 || i == 0)
    return(0);
else
    if (i!=ROWS*COLS)
        {
        printf("\nError(readBlock): Premature End of File, i=%d",i);
        return(0);
        }
    else
        {
#if DEBUG
        printf("Record %04x, Copy %02x: ",record,copy);
#endif
        totalBlocks++;
        return(i);
        }
}                                                         /* ReadBlock */
/*------------------------- writeBlock -------------------------------*/
void writeBlock(buffer,fp)
char *buffer;
int fp;                                                   /* file pointer */
{
#if LIVE_DATA
    if (write(fp,blockHdr,6) == -1)
        {
        printf("\nError(writeBlock): Can't write blockHdr");
        exit(1);
        }
#endif
    if (write(fp,buffer,ROWS*COLS) == -1)
        {
        printf("\nError(writeBlock): Can't write buffer");
        exit(1);
        }
}                                                         /* writeBlock */
/*------------------------- main -------------------------------------*/
main()
{
printf("dec.c, (c) %s Ron Dotson;   correcting '%s'",VERSION,inFileName);
printf(" to '%s'\n",gudFileName);
openFiles();
while (readBlock(crc))
    {
    if (corrected(crc,dat))
        corrections++;
    }
close(inFile);  close(gudFile); close(badFile);
```

```
printf("\n%d total blocks: %d Good, ",totalBlocks,goodBlocks);
printf("%d Bad, %d corrected",badBlocks,corrections);
printf(" (approx. %d badChecks)",badChecks);
}                                                                /* main */
/* end of dec.c */
```

What is claimed is:

1. A method of error detection and correction in the storage and recovery of digital data, comprising the steps of:

encoding data to be stored in a matrix format;

adding row checksum locations to the matrix in a first column in which each row checksum location is in a particular row and the data stored therein represents a predetermined mathematical relationship with the remaining locations in that row;

adding column checksum locations to the matrix in a single row in which each column checksum location is in a particular column and the data stored therein represents a predetermined mathematical relationship with the remaining locations in that column;

adding row alignment locations to each row in the matrix in a second column in which each such location includes predetermined alignment data;

adding a row checksum checksum location;

adding a column checksum checksum location;

wherein one of the column checksum checksum or row checksum checksum is located at the intersection of the row of column checksums and the column of row checksums;

wherein the other of the column checksum checksum or row checksum checksum is located in the column of row alignment locations;

storing the encoded matrix of digital data;

removing the encoded matrix of digital data from storage;

then monitoring the alignment of the data in each row alignment location to determine alignment accuracy and attempting to realign any row in which the data in the alignment location indicates misalignment;

comparing the data in each checksum row and column location to determine if that data accurately reflects the appropriate predetermined mathematical relationship with the locations related thereto;

attempting to correct the data in locations in which comparison of the data in the checksum row and column location indicates an error may have occurred; and decoding the matrix by stripping out all checksum row and column and row alignment locations.

2. A system for the storage and recovery of digital data with error detection and correction, comprising in combination:

means for encoding data to be stored in a matrix format by adding row checksum locations to the matrix in a first column in which each row checksum location is in a particular row and the data stored therein represents a predetermined mathematical relationship with the remaining locations in that row and by adding column checksum locations to the matrix in a single row in which each column checksum location is in a particular column and the data stored therein represents a predetermined mathematical relationship with the remaining locations in that column;

means for adding row alignment locations to each row in a second column in the matrix before the matrix is stored in which each such location includes predetermined alignment data;

means for adding a row checksum checksum location in which the data stored therein represents a predetermined mathematical relationship with the row checksums;

means for adding a column checksum checksum location in which the data stored therein represents a predetermined mathematical relationship with the column checksums;

wherein one of the column checksum checksum or row checksum checksum is located at the intersection of the row of column checksums and the column of row checksums;

wherein the other of the column checksum checksum or row checksum checksum is located in the column of row alignment locations;

means for storing the encoded matrix of digital data;

means for removing the encoded matrix of digital data from storage;

means for monitoring the alignment of the data in each row alignment location after the matrix is removed from storage to determine alignment accuracy;

means for attempting to realign any row in which monitoring of the data int he alignment location indicates that a misalignment error may have occurred;

means for comparing the data in each checksum row and column location to determine if that data accurately reflects the appropriate predetermined mathematical relationship with the locations related thereto;

means for attempting to correct the data in locations in which comparison of the data in the checksum row and column location indicates an error may have occurred; and means for decoding the matrix by stripping out all checksum row and column locations and row alignment locations.

* * * * *